United States Patent [19]

Ha et al.

[11] Patent Number: 5,366,910
[45] Date of Patent: Nov. 22, 1994

[54] PROCESS FOR THE PRODUCTION OF THIN FILM TRANSISTORS USING ON SOG FILM

[75] Inventors: Hyoung C. Ha; Dong K. Choi, both of Seoul, Rep. of Korea

[73] Assignee: Hyundai Electronics Industries Co., Ltd., Rep. of Korea

[21] Appl. No.: 127,994

[22] Filed: Sep. 28, 1993

[30] Foreign Application Priority Data

Sep. 29, 1992 [KR] Rep. of Korea .................. 92-17793

[51] Int. Cl.$^5$ ........................................... H01L 21/469
[52] U.S. Cl. ................................ 437/40; 437/231; 437/937
[58] Field of Search ............... 437/40, 18, 24, 231, 437/238, 247, 248, 937, 952, 959, 978, 982; 148/DIG. 3, DIG. 40, DIG. 78, DIG. 133

[56] References Cited

U.S. PATENT DOCUMENTS

| | | | |
|---|---|---|---|
| 4,885,262 | 12/1989 | Ting et al. | 437/231 |
| 5,252,515 | 10/1993 | Tsai et al. | 437/978 |
| 5,254,497 | 10/1993 | Liu | 437/231 |

*Primary Examiner*—Brian E. Hearn
*Assistant Examiner*—Chandra Chaudhari

*Attorney, Agent, or Firm*—Popham, Haik, Schnobrich & Kaufman, Ltd.

[57] ABSTRACT

A process for producing a thin film transistor suitable to a high integrated static ram (SRAM) or a liquid crystal display, thereby improvements in a leak current and an operating current along with a process for the production of a thin film transistor.

The process comprises a step of forming a SOG film in a predetermined thickness on the entire upper surface of a TFT structure and subsequently treating the SOG film with $O_2$ plasma to increase the hydrogen content therein, a step of depositing an insulating film on the SOG film to prevent the hydrogen of SOG film from escaping therefrom and thereafter, applying heat treatment to the SOG film to infiltrating the hydrogen of the SOG film into a channel formed in a polysilicon layer in the TFT structure, and a step of removing the insulating film and the SOG film.

There may be reduced a leak current when switching off the TFT as well as increased an operating current when switching on the TFT. Accordingly, in accordance with the present invention, the characteristics of TFT is greatly improved.

11 Claims, 3 Drawing Sheets

PROCESS FOR THE PRODUCTION OF THIN FILM TRANSISTORS USING ON SOG FILM

BACKGROUND OF THE INVENTION

1. Field of the Invention

The present invention relates in general to a process for producing a thin film transistor suitable to a high integrated static ram (SRAM) or a liquid crystal display, and more particularly to improvements in a leak current and an operating current along with a process for the production of a thin film transistor.

2. Description of the Prior Art

Generally, there occurs a leak current in a thin film transistor (hereinafter "TFT"), which is widely used for operating a liquid crystal display or a SRAM, For example, high temperature treatment has been recently applied to the production of TFT to form an oxide film therein. However, the high temperature treatment causes a leak current to increase in a produced TFT.

In order to reduce the leak current in a TFT, various efforts has been made. In an effort to solve the problem, it is well known to those skilled in the art to increase the hydrogen content of a channel polysilicon layer in the TFT. An increase in the hydrogen content effects a decrease in dangling bond in the channel polysilicon layer, which subsequently brings about reduction of the leak current when switching off the TFT. In addition, the increase in hydrogen content makes it possible to augment an operating current when switching on the TFT. Accordingly, the characteristics of the TFT may be improved owing to the increase in the hydrogen content.

Conventionally, a plasma method utilizing hydrogen gas has been used for increasing the hydrogen content of a channel polysilicon layer in the TFT. Another method is undertaken for the same purpose, as well, comprising depositing PECVD SiN, applying heat treatment to the deposited film and infiltrating hydrogen of the PECVD SiN film into a channel polysilicon layer in the TFT.

However, the problem with these methods is that a sufficient amount of hydrogen does not permeate the channel polysilicon layer.

SUMMARY OF THE INVENTION

Therefore, in view of the aforementioned problems encountered in the prior art, an object of the invention is to provide a process for the production of TFT, which comprises forming a TFT structure, coating the upper surface of the TFT stricture with a spin-on-glass (hereinafter "SOG") film, treating the SOG film with $O_2$ plasma, exposing the resulting SOG film to the atmosphere for a definite time to increase a hydrogen gas content of the SOG film, and applying heat treatment to the SOG film to infiltrate the hydrogen gas of the SOG film into a channel polysilicon layer in the TFT structure, thereby enabling a leak current and an operating current to be improved in the TFT.

There is illustrated the mechanism whereby the hydrogen is infiltrated into the SOG film, as follows: first, treatment off the SOG film with $O_2$ plasma allows oxygen radicals to penetrate the SOG film, so that they may react with hydrocarbon groups existing within the SOG film, such as methyl groups ($CH_3$), ethyl groups ($C_2H_5$) etc. to form carbon dioxides ($CO_2$) and hydrogen radicals (H), which then come off from the SOG film; subsequently, exposure of the resulting SOG film to the atmosphere allows hydrogen gas ($H_2$) of the atmosphere to permeate the SOG film, so that hydrogen radicals are absorbed into the empty space that the hydrocarbon has occupied.

In a preferred embodiment of the invention, the above object can be accomplished by providing a process for producing a TFT, comprising a step of forming a SOG film in a predetermined thickness on the entire upper surface of a TFT structure having also or even a metal in contact with a source and drain electrode and a gate electrode and subsequently treating the COG film with $O_2$ plasma to increase the hydrogen content therein, and a step of depositing an insulating film on the COG film to prevent the hydrogen of COG film from escaping therefrom and thereafter, and a step of applying heat treatment to the COG film to infiltrating the hydrogen of the COG film into a channel polysilicon layer in the TFT structure.

In another embodiment of the present invention, there is provided a process for the production of TFT, comprising a step of forming a SOG film in a predetermined thickness on the entire upper surface of a TFT structure having a source and drain region of polysilicon and a channel polysilicon layer therein and subsequently, treating the SOG film with $O_2$ plasma to increase the hydrogen content therein a step of depositing an insulating film on the SOG film to prevent the hydrogen of SOG film from escaping herefrom and thereafter, applying heat treatment to the SOG film to infiltrate the hydrogen of the SOG film into a channel polysilicon layer in the TFT structure.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1A:
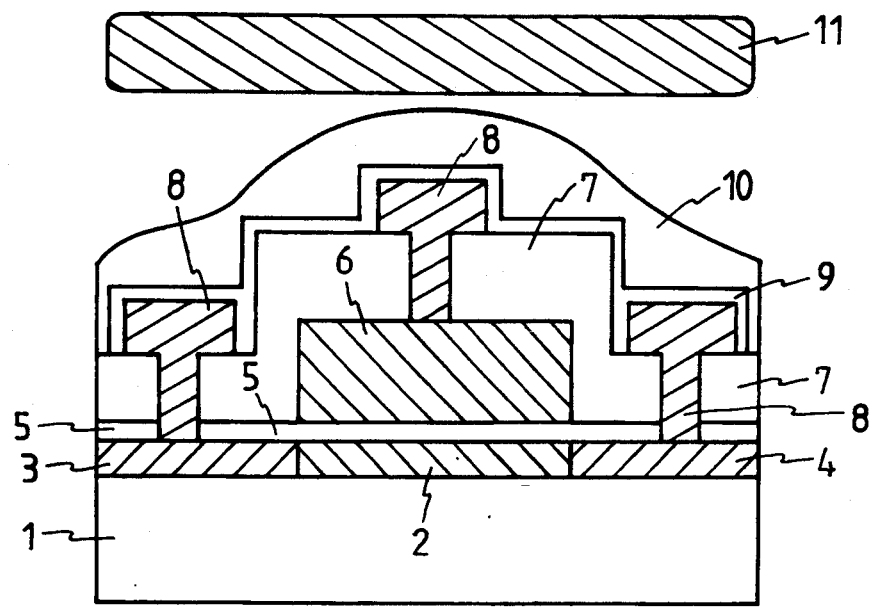
FIGS. 1a, 1b and 1c are step diagrams showing a process for producing a thin film transistor according to a first embodiment of the invention.
Figure 1B:
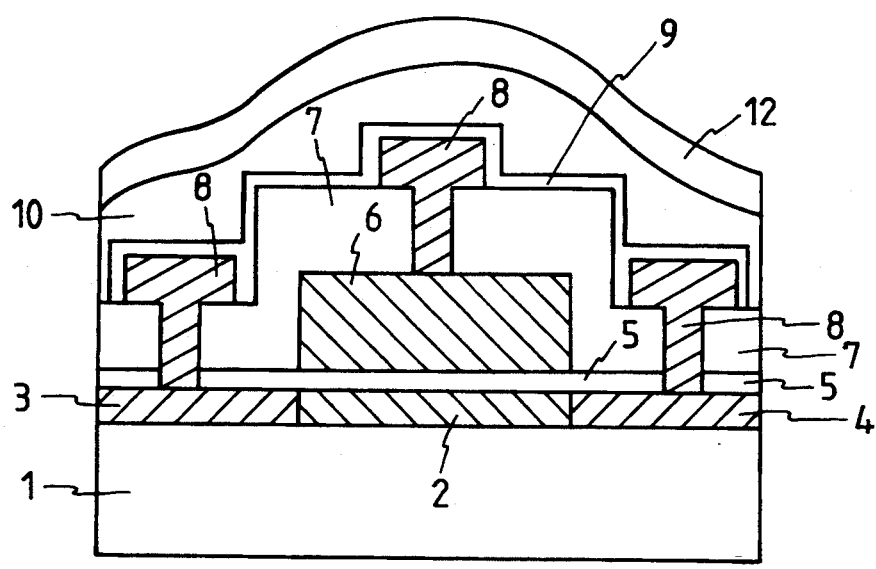
Figure 1C:
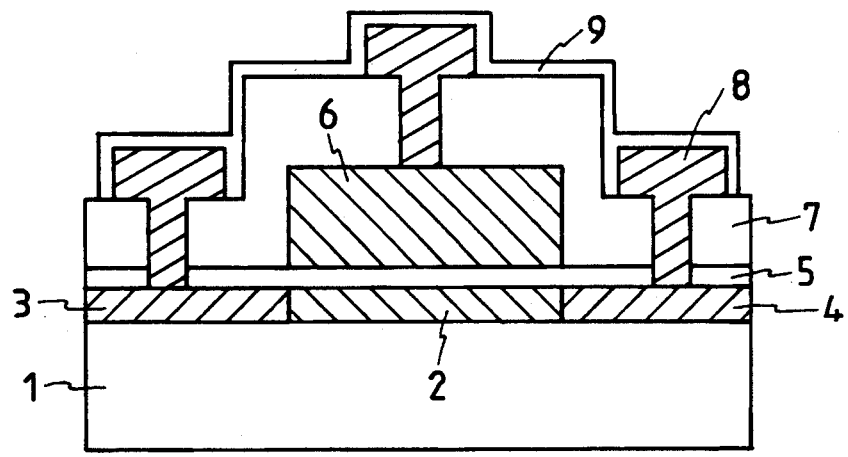

Hereinafter, preferred embodiments of the invention will be described in detail with reference to the drawing, and initially to FIG, 1, there is a process flow for a TFT in accordance with the present invention.

First, in step A, a TFT structure is constructed of an insulating substrate 1 on which there is formed a channel polysilicon layer 2 having a source electrode 3 and drain electrode 4 of polysilicon at both sides thereof. The TFT structure has also a gate insulating film 5 formed entirely and a gate 6 of polysilicon formed thereon, in sequence. The TFT structure is finished by forming a inter-layer insulating film 7 and depositing a metal to contact the source electrode 3, the drain electrode 4 and the gate electrode 6, respectively. In a subsequent process, following depositing entirely a protective film 9 for the electrode 8, such as a silicon oxide film or an insulating film, a SOG film 10 is formed on the protective film 9 and treated with $O_2$ plasma 11 which is generated at 300° to 400° C. under a pressure off 9 torrs and a RF power of 500 watts. Thereafter, the SOG film 10 is exposed to the atmosphere for a definite time, for example, 1 to 2 hours to increase the hydrogen content of the SOG film 10.

For reference, though there is shown in step A a top structure in which the gate 6 is formed over the upper surface of the channel polysilicon layer 2, yet a bottom structure in which the gate is formed below the channel polysilicon layer may be employed in the invention.

Subsequently, in step B, a protective film 12, for example, a silicon oxide film is deposited on the SOG film 10 in order to prevent the hydrogen from escaping from the SOG film 10. Following this, heat treatment is applied to the SOG film 10 for a definite time at a definite temperature. The heat treatment forces the hydrogen included within SOG film 10 to penetrate the channel polysilicon layer 2 through the insulating layer 9 and the gate 6. This is possible since the size of the hydrogen particle is so small as to go through those layers and films.

Step C is undertaken to carry out removing the protect film 12 and the SOG film 10.

Besides the $O_2$ plasma, plasma including an oxygen atom, such as $N_2O$ plasma and the like may be used to decompose the hydrocarbon within the SOG film.

According to the above first embodiment of the invention, the hydrogen permeates not only the channel polysilicon layer but also other layers or regions. However, the hydrogen content of the channel polysilicon layer is most important in operating a TFT.

Figure 2A:
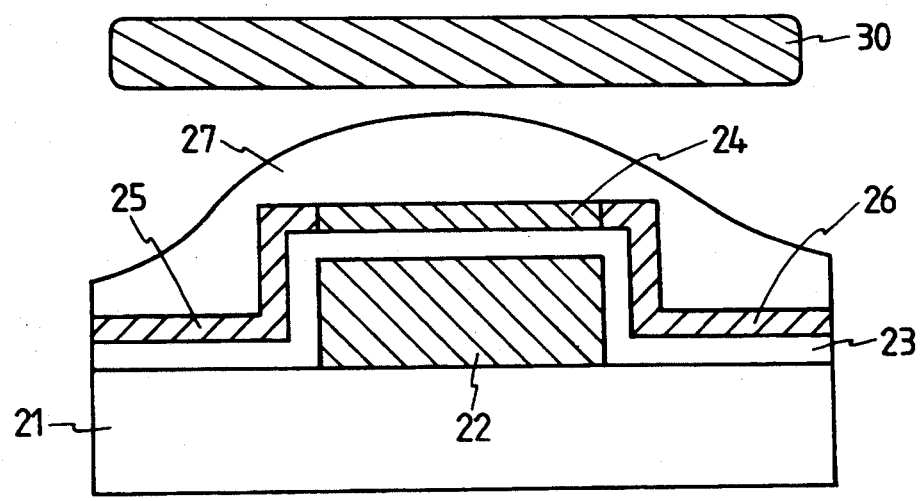
FIGS. 2a, 2b and 2c are step diagrams showing a process for producing a thin film transistor according to a second embodiment of the invention.
Figure 2B:
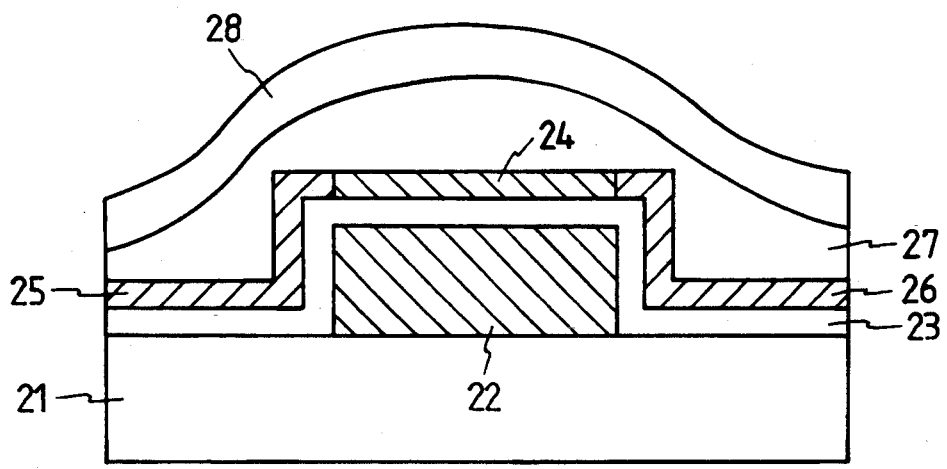
Figure 2C:
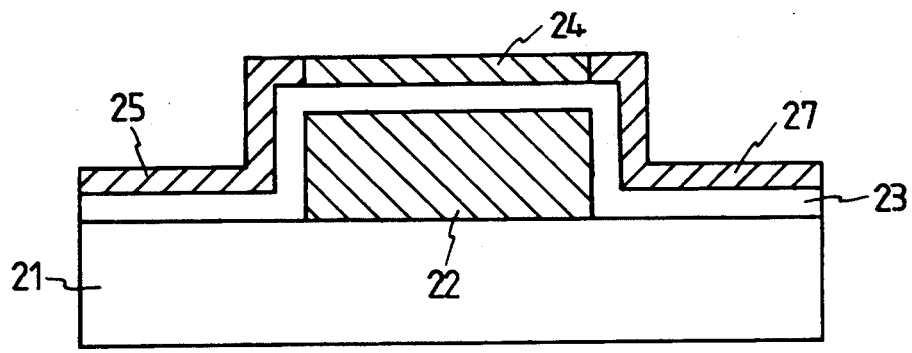

Turning now to FIG. 2, there is illustrated a process flow according to a second embodiment of the invention.

First, in step A, a TFT structure is made of an insulating substrate 21 on which there is formed a Gate electrode 22 of polysilicon layer covered with a gate insulating film 23. The TFT structure has a channel polysilicon layer 24 having a source electrode 25 and drain electrode 26 of polysilicon at both sides thereof, which is formed on the insulating film 23. In a subsequent process, the upper surface of the TFT structure is coated with a SOG film 27, which is then treated with $O_2$ plasma, followed by exposure into the atmosphere for a definite time so as to increase the hydrogen content of the SOG film 27.

For reference, though there is shown in step A a bottom structure in which the gate 22 is formed below the lower surface of the channel polysilicon layer 24, yet a top structure in which the gate is formed over the channel polysilicon layer 24 may be employed in the invention.

Subsequently, in step B, a protective film 28, for example, a silicon oxide film is deposited on the SOG film 27 in order to prevent the hydrogen from escaping from the SOG film 27. Following this, the SOG film 27 is subjected to heat treatment for a definite time at a definite temperature in order that the hydrogen permeates the channel polysilicon layer 24.

Lastly, step C is undertaken to carry out removing the protect film 28 and the SOG film 27.

Herein, it is appreciated that plasma including an oxygen atom, such as $N_2O$ and the like may be used instead of she $O_2$ plasma.

As explained hereinbefore, in the TFT according to the present invention, the hydrogen content of the channel polysilicon layer is increased by making use of SOG film and plasma including an oxygen atom, so that a leak current may be reduced when switching off the TFT, as well as an increased operating current when switching on the TFT. Accordingly, in accordance with the present invention, the characteristics of TFT is greatly improved.

What is claimed is:

1. A process for producing a thin film transistor, said process comprising the steps of:
   (a) providing a thin film transistor structure having a source, a drain, a channel polysilicon layer, and an upper surface above the source, the drain, and the channel polysilicon layer;
   (b) following said step (a), forming an inter-layer insulating film on the upper surface of the thin film transistor structure;
   (c) following said step (a), depositing a metal to contact the source, the drain, and the channel polysilicon layer, respectively, to form a resulting TFT structure having an upper surface;
   (d) following said steps (b) and (c), forming an insulating film on the upper surface of the resulting TFT structure;
   (e) following said step (d), coating the insulating film with a spin-on-glass film having a hydrogen content;
   (f) following said step (e), treating the spin-on-glass film with a plasma including an oxygen atom;
   (g) following said step (f), exposing the spin-on-glass film to a hydrogen-containing atmosphere to increase the hydrogen content of the spin-on-glass film;
   (h) following said step (g), depositing a protective film on the spin-on-glass film; and
   (i) following said step (h), applying a heat treatment to the spin-on-glass film to infiltrate the hydrogen into the channel polysilicon layer.

2. The process according to claim 1, wherein in said step (f), the plasma is an $O_2$ plasma.

3. The process according to claim 1, wherein in said step (f), the plasma is an $N_2O$ plasma.

4. The process according to claim 1, wherein in said step (a), the thin film transistor structure has a top structure, and wherein said process further comprises the step of forming a gate over the channel polysilicon layer, following said step (d).

5. The process according to claim 1, wherein in said step (a), the thin film transistor structure has a bottom structure, and wherein said process further comprises the step of forming a gate below the channel polysilicon layer, following said step (d).

6. A process for producing a thin film transistor, said process comprising the steps of:
   (a) constructing in a conventional manner a thin film transistor structure having a gate electrode of polysilicon layer, a gate insulating film, a source electrode of polysilicon layer, a drain electrode of polysilicon layer, a channel polysilicon layer, and an upper surface above the source, the drain, and the channel polysilicon layer;
   (b) following said step (a), forming a spin-on-glass film on the upper surface of the thin film transistor;
   (c) treating the spin-on-glass film with a plasma including an oxygen atom, the spin-on-glass film having a hydrogen content;
   (d) following said step (c), exposing the spin-on-glass film to a hydrogen-containing atmosphere to increase the hydrogen content of the spin-on-glass film;
   (e) following said step (d), depositing a protective film on the spin-on-glass film; and (f) following said step (e), applying a heat treatment to the spin-on-glass film to infiltrate the hydrogen into the channel polysilicon layer.

7. The process according to claim 6, wherein in said step (c), the plasma is an $O_2$ plasma.

8. The process according to claim 6, wherein in said step (c), the plasma is an $N_2O$ plasma.

9. The process according to claim 6, wherein in said step (e), the protective film is a silicon oxide film.

10. The process according to claim 6, wherein in said step (a), the thin film transistor structure has a bottom structure, and wherein said process further comprises the step of forming a gate below the channel polysilicon layer, following said step (a).

11. The process according to claim 6, wherein in said step (a), the thin film transistor structure has a top structure, and wherein said process further comprises the step of forming a gate over the channel polysilicon layer, following said step (a).

* * * * *